PARALLEL OPERATIONAL RECTIFIERS

Filed Oct. 20, 1966

INVENTOR.
PETER L. RICHMAN
BY Arnold & Roylance
ATTORNEYS 3,480,794
Patented Nov. 25, 1969

3,480,794

PARALLEL OPERATIONAL RECTIFIERS

Peter L. Richman, Lexington, Mass., assignor to Weston Instruments, Inc., Newark, N.J., a corporation of Delaware Filed Oct. 20, 1966, Ser. No. 588,195
Int. Cl. G06g *7/12;* H03k *5/00*
U.S. Cl. 307—229 11 Claims

ABSTRACT OF THE DISCLOSURE

Operation rectifier apparatus including two operational rectifier channels each of which has an operational amplifier and two diode feedback circuits. An input signal is connected to the iputs of both channels. A summing circuit is connected in one of the channels to sum the output of the operational amplifier of the first channel with the output of the second channel. The recifier output is taken from an intermediate point in one of the feedback circuits of the first channel. A particularly useful summing circuit is also disclosed in which the signals to be summed are connected to the base electrodes of two transistors connected in an emitter-follower pair, or long-tailed pair, the emitter-collector current thus developed being used to control conductivity in a third transistor.

This invention relates to electrical apparatus for accurately rectifying an electrical signal.

Operational amplifiers have been employed in the past to perform various wave conversion functions and, specifically, to provide a rectified wave from an AC input signal. The prior art apparatus is subject to the serious disadvantage of poor bandwidth response, and particularly of inadequate gain at higher frequencies.

Briefly described, the present invention overcomes this disdvantage by using parallel operational amplifier channels, each including an amplifier and two feedback loops. The inputs to the two operational amplifier channels are connected to a common input signal source and the outputs of the amplifiers in those channels are summed to eliminate the amplification error existing at the higher frequencies.

The feedback loops each include rectifier means and a feedback resistor, the rectified output signal being taken from one of the loops of one amplifier channel at the junction of the resistor and the rectifier means. The choice of from which rectifier means loop the output signal is taken depends on the desired polarity of the output signal.

One object of this invention is to provide apparatus for accurately rectifying an input signal to obtain an output signal having a predetermined relationship to the input signal.

Another object is to provide apparatus for performing a precision rectification function over a relatively wide range of input signal frequencies.

Yet another object is to provide a precision rectification apparatus wherein increased overall effective feedback gain is obtained at higher frequencies.

In order that the manner in which the foregoing and other objects are attained in accordance with the invention can be understood in detail, particularly advantageous embodiments thereof will be described with reference to the accompanying drawings, which form a part of this specification, and wherein.

Figures 1, 2:
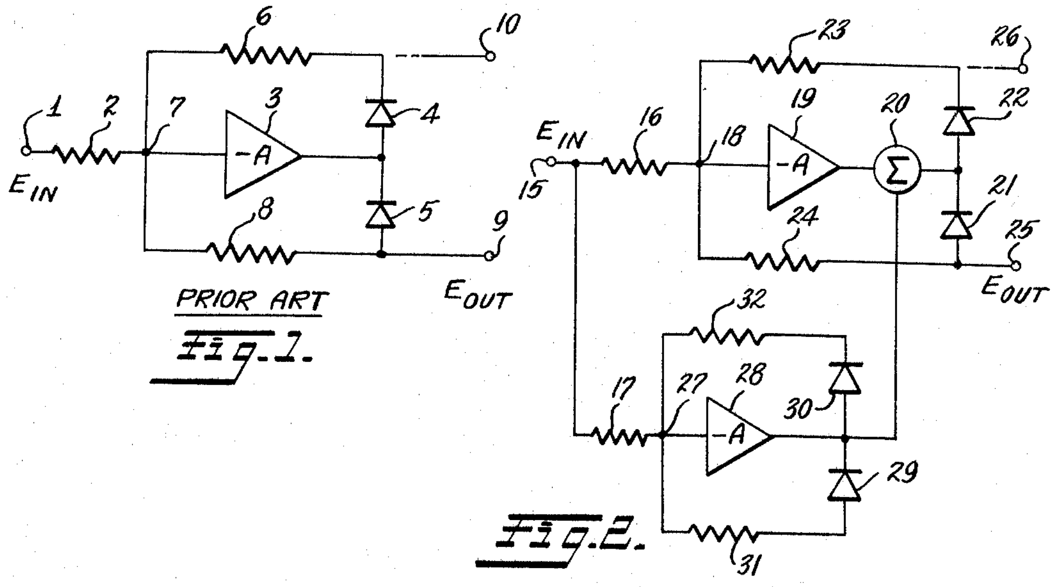
FIG. 1 is a schematic diagram, partly in block form, of a prior art circuit.
FIG. 2 is a schematic diagram, partly in block form, of a rectifying apparatus in accordance with the broad aspects of the invention.

In the relatively simple circuit of FIG. 1 an input terminal 1, to which AC input signals can be provided, is connected to one end of a fixed input resistor 2, the other end of which is connected to the input terminal 7 of a single operational rectifier circuit including an inverting high gain amplifier 3. The output of amplifier 3 is connected to the anode electrode of a semiconductor diode 4 and to the cathode electrode of a semiconductor diode 5. Diode 4 is connected in series circuit relationship with a fixed resistor 6, the other end of this series circuit being connected to the input of amplifier 3 at junction 7. Diode 5 is connected in series circuit relationship with a fixed resistor 8, the other end of which is also connected to junction 7 at the input of amplifier 3.

An output terminal 9 is connected to the junction of diode 5 and resistor 8. It will be recognized that connecting the output terminal to the feedback loop including diode 5 and resistor 8 will result in an output signal having one polarity. To obtain an output signal having the opposite polarity an output terminal 10 can optionally be connected to the junction of diode 4 and resistor 6 as shown in FIG. 1.

The operation of the circuit of FIG. 1 commences with the application of a voltage to terminal 1 which drives a current through resistor 2 to junction 7. The difference between this current and the feedback currents from resistors 6 and 8 appears at the input of amplifier 3 and is amplified, the resulting signal being conducted alternately by the two feedback circuits, the circuit including diode 4 carrying current during one half of each cycle and the circuit including diode 5 carrying current during the other half of the cycle, assuming the input signal to be, for example, periodic symmetrical alternating current, although the invention is clearly not limited to currents of this specific character. Thus, the signal appearing at terminal 9 will be a series of negative pulses of approximately sinusoidal shape. The relatively high negative feedback provided through resistors 6 and 8 maintains the amplifier system stable and the overall network gain relatively low as in conventional operational amplifier performance.

As mentioned above, the primary disadvantage with the circuit of FIG. 1 is the inadequate overall feedback gain at high frequencies. This difficulty is eliminated by the circuit shown in FIG. 2 wherein an input terminal 15 is connected to one terminal of a resistor 16 and to one terminal of a fixed resistor 17. The other terminal of resistor 16 is connected to a junction 18 which is the input terminal to one operational rectifier channel. Terminal 18 is connected to a high gain amplifier 19 within that channel. The output terminal of amplifier 19 is connected to one input terminal of a summing circuit 20, the output terminal of which is connected to the cathode of a semiconductor diode 21 and to the anode of a semiconductor diode 22. The cathode of diode 22 is connected via a fixed resistor 23 as a feedback circuit to summing junction 18. The anode of diode 21 is connected via a fixed resistor 24 as a second feedback circuit to junction 18. An output terminal 25 is connected to the junction between diode 21 and resistor 24. As in FIG. 1, an output terminal 26 can optionally be connected to the junction between diode 22 and resistor 23 to obtain an output signal having a polarity opposite to that developed at output termial 25.

Fixed input resistor 17 is connected to a summing junction 27 which is the input terminal to a second operational rectifier channel which includes a high gain amplifier 28, the input terminal of which is connected to junction 27. The output terminal of amplifier 28 is connected to the cathode of a semiconductor diode 29 and to the anode of a semiconductor diode 30. Diode 29 is connected in series circuit relationship with a fixed resistor 31, the series circuit forming a feedback circuit between the output terminal of amplifier 28 and summing junction 27. Similarly, diode 30 is connected in series circuit relationship with a fixed resistor 32 forming a second feedback circut between the output terminal of amplifier 28 and junction 27. The output terminal amplifier 28 is also connected to a second input terminal of summing circuit 20 in the first operational rectifier channel.

The circuit of FIG. 2 will be seen to include two parallel operational rectifier channels which together form a system having a much more stable response over a wider frequency range. The input signal applied to input terminal 15 is connected simultaneously through resistors 16 and 17 to junctions 18 and 27 in the two channels. As with the circuit of FIG. 1, the channel including amplifier 19 amplifies the input signal, rectifies that signal by the action of diodes 21 and 22 and provides the rectified output signal at terminal 25, the feedback through resistors 23 and 24 providing the stable operational amplifier operation discussed above. If no input is provided to summing circuit 20 from the output of amplifier 28 the circuit would operate substantially as that of FIG. 1. However, when the input signal is applied to junction 27, amplifier 28 normally provides an output to summing junction 20 which is substantially the same as the output which amplifier 19 would supply to summing junction 20 if the output from amplifier 28 were disconnected. Thus, throughout the frequency range in which the circuit of FIGURE 1 would have good response and would provide an adequately accurate rectified output, the auxiliary signal fed from amplifier 28 to the input of summer 20 operates to suppress the signal required at the output of amplifier 19, since that signal need only make up the difference between the signal from the output of amplifier 28 and the feedback signal which is required (by amplifier 19) to flow through feedback resistors 23 and 24, around amplifier 19. When the output signals developed by amplifier 28 and 19 diminish because the frequency of the input signal enters that region of relatively poor response, addition of the output signal from amplifier 28 to the input of summer 20 still maintains the required output signal from the output of amplifier 19 at a far lower potential than that which would be necessary were amplifier 28 not connected. Thus, the output of amplifier 19 merely must supply the additional signal required to make up the difference between the output of amplifier 28 and that signal which is required to flow through the feedback paths, i.e. resistors 23 and 24. By this technique, if the circuit of FIG. 1 were to have a 10% error at a given frequency, the addition of the parallel amplifier in FIG. 2 would reduce this error to the square of this factor, or 1%. For a 1% error in the circuit of FIG. 1, the total overall error in performance of the circuit in FIG. 2 would be .01%. Thus the effective gain of the overall operational rectifier channel including amplifier 19 is allowed to increase and the rectified signal appearing at output terminal 25 remains substantially constant in peak amplitude.

It will be noted that if the values of resistors 23, 24, 31 and 32 are substantially equal, and if input resistors 16 and 17 are also equal to each other, the output of amplifier 28 itself will be very nearly equal to that value of potential which is required at the output of amplifier 19 to render diodes 21 and 22 conductive and to provide a pulsed sign wave output at terminal 25. Thus the amount of signal required at the output of amplifier 19 is substantially reduced at the poorer response freqeuncies, the actual factor of reduction being a function of the similarity between the diodes in the two operational rectifier circuits, of the performance of summing circuit 20 and of the values of the six resistors in these two circuits. It will be noted that the signals from the first and second amplifiers in the circuit of FIG. 2 are summed within the main feedback loop before the signal is divided into the individual feedback loops, and before it is rectified.

Figure 3:
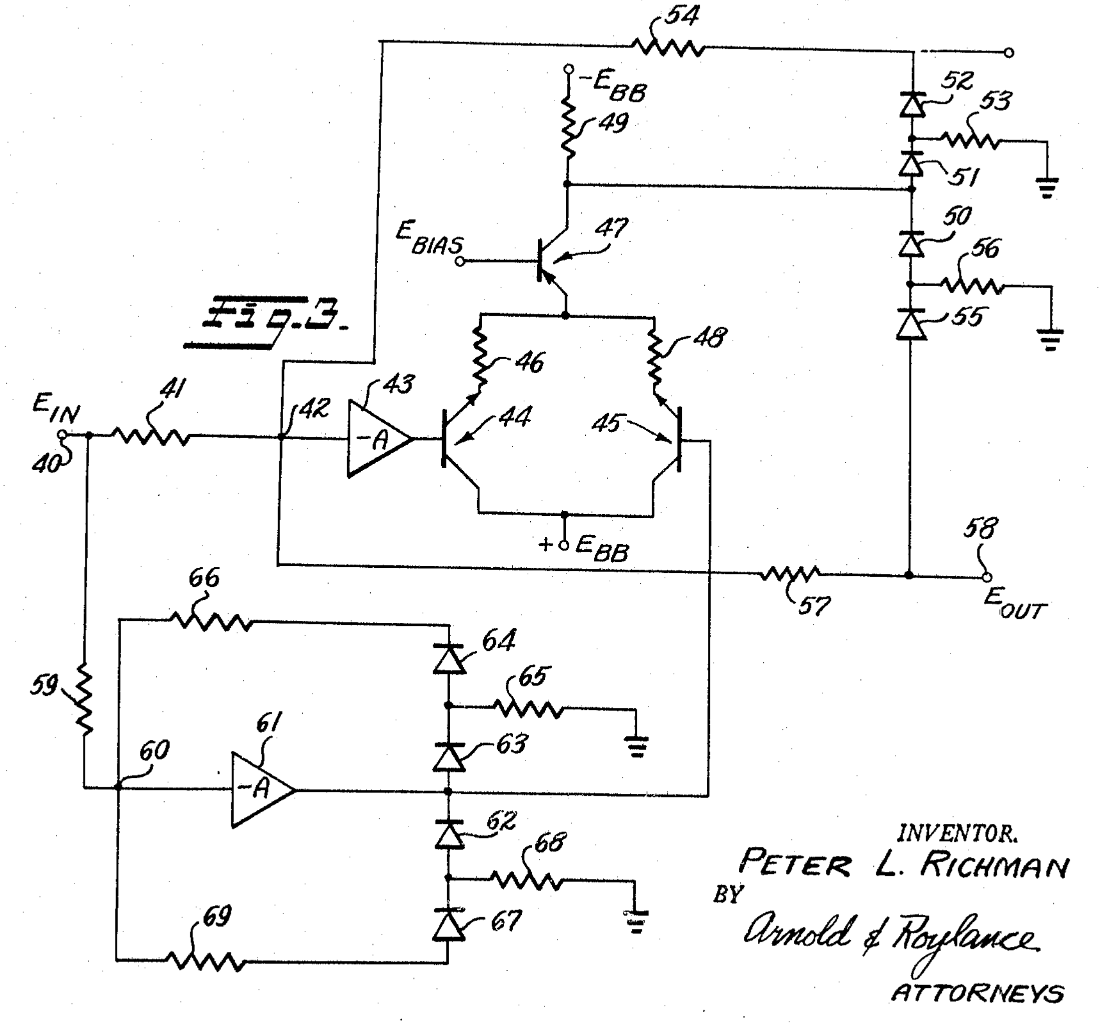
FIG. 3 is a schematic diagram, partly in block form, of a rectifying apparatus in accordance with one embodiment of the invention.

Referring now to FIG. 3, it will be seen that a substantially similar arrangement as that in FIG. 2 is shown, but with the addition of a particular summing circuit arrangement, and with a modified feedback circuit arrangement. In FIG. 3 the input signal is applied to an input terminal 40 which is connected to one terminal of a fixed resistor 41 and to one terminal of a fixed resistor 59. The other terminal of resistor 41 is connected to a summing junction 42 which is the input terminal for a first operational rectifier channel. The input terminal of a high gain amplifier 43 in this first channel is connected to junction 42, and the output terminal of amplifier 43 is connected to the base electrode of an NPN transistor indicated generally at 44. Transistor 44 is one transistor in the summing circuit analogous to summing circuit 20 of the circuit of FIG. 2. The other input terminal of this summing circuit is at the base electrode of an NPN transistor indicated generally at 45. The collector electrodes of transistors 44 and 45 are connected to a source of positive DC voltage. The emitter electrode of transistor 44 is connected to one terminal of a summing resistor 46, the other terminal of which is connected to the emitter electrode of a PNP transistor indicated generally at 47. The base electrode of transistor 47 is connected to a source of DC bias voltage. The emitter electrode of transistor 45 is connected to a fixed summing resistor 48, the other terminal of which is also connected to the emitter electrode of transistor 47. The collector electrode of transistor 47 is connected via a fixed resistor 49 to a source of negative DC voltage, the electrode also being connected to the cathode of a semiconductor diode 50 and the anode or a semiconductor diode 51. The cathode of diode 51 is connected to the anode of a semiconductor diode 52 and to one terminal of a fixed resistor 53, the other terminal of which is connected to a point of reference potential, shown in FIG. 3 as ground. The cathode of diode 52 is connected via a fixed resistor 54 to junction 42.

The anode of diode 50 is connected to the cathode of a semiconductor diode 55 and to one terminal of a fixed resistor 56, the other terminal of which is connected to ground. The anode of diode 55 is connected via a fixed resistor 57 to junction 42, and is also connected to an output terminal 58.

Fixed resistor 59 couples the input signal to a resistive summing junction 60 which is the input terminal to a second operational rectifier channel. The input terminal of a high gain amplifier 61 is connected to junction 60, the output terminal of amplifier 61 being connected to the cathode electrode of a semiconductor diode 62 and to the anode electrode of a semiconductor diode 63. The output of amplifier 61 is also connected to the base electrode of transistor 45 as the second input to the summing circuit in the first channel. The cathode electrode of diode 63 is connected to the anode electrode of a semiconductor diode 64 and via a fixed resistor 65 to ground. The cathode of diode 64 is connected via a fixed resistor 66 to junction 60. The anode electrode of diode 62 is connected to the cathode electrode of a semiconductor diode 67 and via a fixed resistor 68 to ground. The anode of diode 67 is connected via a fixed resistor 69 to junction 60.

As will be recognized, a first feedback circuit is formed in the first operational rectifier channel in FIG. 3 by diodes 51 and 52 and resistor 54 connected in series circuit relationship between the output of the summing circuit and junction 42. Similarly, diodes 50 and 55 with resistor 57 form a second feedback circuit in that channel. Similarly, the series circuit connections of diodes and resistors in the second channel form the feedback loops for amplifier 61. Resistors 53, 56, 65, and 68 are connected between the diodes to form a shunt path to ground for leakage currents through the diodes in the reverse direction, and also to shunt stray capacitive currents inevitably present in such diodes.

The summing circuit shown in FIG. 3, including transistors 44, 45, and 47, is arranged to sum the currents provided to the base electrodes of transistors 44 and 45 by amplifiers 43 and 61 respectively. Transistors 44 and 45 are connected as emitter follower amplifiers which respond to signals at their base electrodes to provide currents through the emitter-collector circuits to resistors 46 and 48. The currents flowing through resistors 46 and 48 are summed into the emitter electrode of transistor 47, this summed current acting to control the current flow in the collector circuit of transistor 47. The voltage produced across resistor 49 by this collector current flow becomes the output of the summing circuit and is connected to the feedback circuits previously described to summing junction 42 at the input of amplifier 43. Resistors 46, 48 and 49 can be selected to be of approximately equal value to set the gain of the stage including transistors 44 and 45 at approximately unity.

The operation of the overall circuit of FIG. 3 need not be described in detail, the primary differences between the circuits of FIG. 2 and FIG. 3 residing in the differences in the summation circuit and the addition to each feedback circuit of a series diode and a shunt resistor to decrease otherwise uncontrolled variations.

While advantageous embodiments have been chosen to illustrate the invention, it will be understood by those skilled in the art that various changes and modifications can be made therein without departing from the scope of the invention as defined in the appended claims.

What is claimed is:

1. Electrical apparatus comprising the combination of a signal input terminal to which electrical signals can be applied; first and second operational amplifier channels, each of said channels having an input terminal and an output terminal, said first channel including an amplifier having an input terminal connected to said first channel input terminal and an output terminal, said first channel further including summing circuit means and first and second feedback circuits connected between said summing circuit means and said channel input terminal, said summing circuit means being connected between said amplifier output terminal and said feedback networks; said second channel including an amplifier having an input terminal connected to said channel input terminal and an output terminal, and third and fourth feedback circuits connected between said amplifier input and output terminals; circuit means interconnecting said amplifier output terminal of said second channel amplifier and said summing circuit means; a first input resistor connected between said signal input terminal and said first channel input terminal; a second input resistor connected between said signal input terminal and said second channel input terminal; and an apparatus output terminal coupled to said first feedback circuit.

2. Apparatus according to claim 1 wherein each of said first, second, third, and fourth feedback circuits comprises an asymmetrically conductive device, one of said asymmetrically conductive devices in one said feedback circuits of each said first and second channels being poled to conduct current in one direction, the remaining devices being poled to conduct in the opposite direction.

3. Apparatus according to claim 1 wherein each of said feedback circuits comprises a resistor and a semiconductor diode connected in series circuit relationship, and said apparatus output terminal is connected at a point between said diode and said resistor in said first feedback circuit.

4. Apparatus according to claim 3 wherein said resistors in said feedback circuits are of substantially equal value.

5. Apparatus according to claim 1 wherein said summing circuit means comprises a first transistor and a second transistor each having a base electrode and an emitter electrode, said first and second transistors being connected as follower emitter amplifiers, the base electrode of said first transistor being connected to said output terminal of said first channel amplifier and the base electrode of said second transistor being connected to said output terminal of said second channel amplifier; and a third transistor coupling the emitter electrodes of said first and second transistors to said first and second feedback circuits.

6. Precision rectifying apparatus comprising the combination of first operational rectifier circuit means for converting an AC input signal to a unidirectional output signal, said first operational rectifier circuit means including an amplifier, summing circuit means connected to the output of said amplifier and first and second feedback circuit means for providing a negative feedback signal to the input of said amplifier; second operational rectifier circuit means for converting an AC input signal to a unidirectional output signal, said second operational rectifier circuit means including an amplifier and third and fourth feedback circuit means for providing a negative feedback signal to the input of said amplifier; an input terminal to which an AC input signal can be applied; first and second circuit means for coupling the AC input signal from said input terminal to said amplifiers in said first and second operational rectifier circuit means, respectively; third circuit means for coupling the output of said second operational rectifier circuit means to said summing circuit means; and an output terminal connected to said first feedback circuit means of said first operational rectifier circuit means.

7. Apparatus according to claim 6 wherein said summing circuit means comprises first, second and third transistors each having a base electrode, an emitter electrode, and a collector electrode, said base electrodes of said first and second transistors being driven by said amplifiers in said first and second operational rectifier circuit means, respectively; first and second summing resistors connected in series circuit relationship with the emitter-collector circuits of said first and second transistors respectively, said first and second resistors also being connected to an electrode of said third transistor; a third resistor connected to another electrode of said third transistor and to said first and second feedback circuit means; and bias circuit means connected to the remaining electrode of said third transistor.

8. Apparatus according to claim 6 wherein each of said feedback circuit means comprises a resistor and a pair of semiconductor diodes connected in series circuit relationship, and said output terminal is connected to the junction between said diodes and said resistor in said first feedback circuit means.

9. Apparatus according to claim 8 wherein the resistors in said feedback circuit means are of substantially equal value.

10. A current summing circuit comprising the combination of first, second and third transistors each having a base electrode, an emitter electrode and a collector electrode; first and second sources of electrical current to be summed, said sources being connected to said base electrodes of said first and second transistors, respectively; bias means connected to the base electrode of said third transistor; first and second summing resistors connected in series circuit relationship with the emitter-collector circuits of said first and second transistors, respectively, said first and second resistors also being connected to said emitter electrode of said third transistor; a circuit output terminal and a third resistor connected to said collector electrode of said third transistor and to said circuit output terminal, the current through the emitter-collector circuit of said third transistor and said third resistor being proportional to the sum of said currents provided by said sources.

11. Apparatus according to claim 10 wherein said first, second and third resistors are of substantially equal value.

References Cited

UNITED STATES PATENTS 3,252,098 5/1966 Schlaepfer ------ 307—229 XR

JOHN S. HEYMAN, Primary Examiner

J. ZAZWORSKY, Assistant Examiner

U.S. Cl. X.R.

328—158, 26; 307—261

Disclaimer and Dedication 3,480,794.—*Peter L. Richman*, Lexington, Mass. PARALLEL OPERATIONAL RECTIFIERS. Patent dated Nov. 25, 1969. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]